US 6,622,061 B1

(12) United States Patent
Toprac et al.

(10) Patent No.: US 6,622,061 B1
(45) Date of Patent: *Sep. 16, 2003

(54) METHOD AND APPARATUS FOR RUN-TO-RUN CONTROLLING OF OVERLAY REGISTRATION

(75) Inventors: Anthony J. Toprac, Austin, TX (US); Christopher A. Bode, Austin, TX (US); Richard D. Edwards, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/160,963

(22) Filed: May 31, 2002

Related U.S. Application Data

(63) Continuation of application No. 09/371,550, filed on Aug. 10, 1999, now Pat. No. 6,405,096.

(51) Int. Cl.[7] .............................................. G06F 19/00
(52) U.S. Cl. ............................ 700/121; 716/21; 438/5; 438/14
(58) Field of Search ............................ 700/121, 31, 57, 700/72, 89; 716/21; 438/5, 14

(56) References Cited

U.S. PATENT DOCUMENTS

| | | | | |
|---|---|---|---|---|
| 6,248,602 B1 | * | 6/2001 | Bode et al. | 438/14 |
| 6,405,096 B1 | * | 6/2002 | Toprac et al. | 700/121 |
| 6,405,144 B1 | * | 6/2002 | Toprac et al. | 702/84 |
| 6,427,093 B1 | * | 7/2002 | Toprac | 700/121 |
| 6,458,605 B1 | * | 10/2002 | Stirton | 438/7 |
| 6,460,002 B1 | * | 10/2002 | Bone et al. | 702/81 |
| 6,528,331 B1 | * | 3/2003 | Bode et al. | 438/14 |
| 6,535,774 B1 | * | 3/2003 | Bode et al. | 700/109 |
| 6,556,959 B1 | * | 4/2003 | Miller et al. | 703/2 |

* cited by examiner

*Primary Examiner*—Emanuel Todd Voeltz
*Assistant Examiner*—Crystal J. Barnes
(74) *Attorney, Agent, or Firm*—Williams, Morgan & Amerson, P.C.

(57) ABSTRACT

The present invention provides for a method and apparatus for correction of overlay control errors. Semiconductor devices are processed based upon control input parameters. The processed semiconductor devices are examined in a review station. The control input parameters are modified in response to the examination of the processed semiconductor devices. New control input parameters are implemented for a subsequent run of the semiconductor device processing step based upon the modification of the control input parameters.

31 Claims, 5 Drawing Sheets

METHOD AND APPARATUS FOR RUN-TO-RUN CONTROLLING OF OVERLAY REGISTRATION

This is a continuation of prior application Ser. No. 09/371,550 filed Aug. 10, 1999, now U.S. Pat. No. 6,405,096.

BACKGROUND OF THE INVENTION

1. Field of the Invention

This invention relates generally to semiconductor products manufacturing, and, more particularly, to a method and means for automated error correction algorithm to control overlay errors.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and, therefore, require a number of inputs that are generally fine tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

One of the most important aspects of semiconductor manufacturing is overlay control. Overlay is one of several important steps in the photolithography area of semiconductor manufacturing. Overlay control involves measuring the misalignment between two successive patterned layers on the surface of a semiconductor device. Generally, minimization of misalignment errors is important to ensure that the multiple layers of the semiconductor devices are connected and functional. As technology facilitates smaller critical dimensions for semiconductor devices, the need for the reduction of misalignment errors increases dramatically.

Generally, photolithography engineers currently analyze the overlay errors a few times a month. The results from the analysis of the overlay errors are used to manually make updates to exposure tool settings. Some of the problems associated with the current methods include the fact that the exposure tool settings are only updated a few times a month. Furthermore, currently, the exposure tool updates are performed manually.

Generally, a set of processing steps is performed on a lot of wafers on a semiconductor manufacturing tool called an exposure tool or a stepper. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface can generally be part of an advanced process control (APC) system. The APC system initiates a control script, which can be a software program that automatically retrieves the data needed to execute a manufacturing process. The input parameters that control the manufacturing process are revised periodically in a manual fashion. As the need for higher precision manufacturing processes are required, improved methods are needed to revise input parameters that control manufacturing processes in a more automated and timely manner.

The present invention is directed to overcoming, or at least reducing the effects of, one or more of the problems set forth above.

SUMMARY OF THE INVENTION

In one aspect of the present invention, a method is provided for correction of overlay control errors. Semiconductor devices are processed based upon control input parameters. The processed semiconductor devices are examined in a review station. The control input parameters are modified in response to the examination of the processed semiconductor devices. New control input parameters are implemented for a subsequent run of the semiconductor device processing step based upon the modification of the control input parameters.

In another aspect of the present invention, an apparatus is provided for correction of overlay control errors. The apparatus of the present invention comprises means for processing semiconductor devices based upon control input parameters, means for examining the processed semiconductor devices in a review station, means for modifying the control input parameters in response to the examination of the processed semiconductor devices, and means for implementing new control input parameters for a subsequent run of the semiconductor device processing step based upon the modification of the control input parameters.

BRIEF DESCRIPTION OF THE DRAWINGS

The invention may be understood by reference to the following description taken in conjunction with the accompanying drawings, in which like reference numerals identify like elements, and in which.

Figure 1:
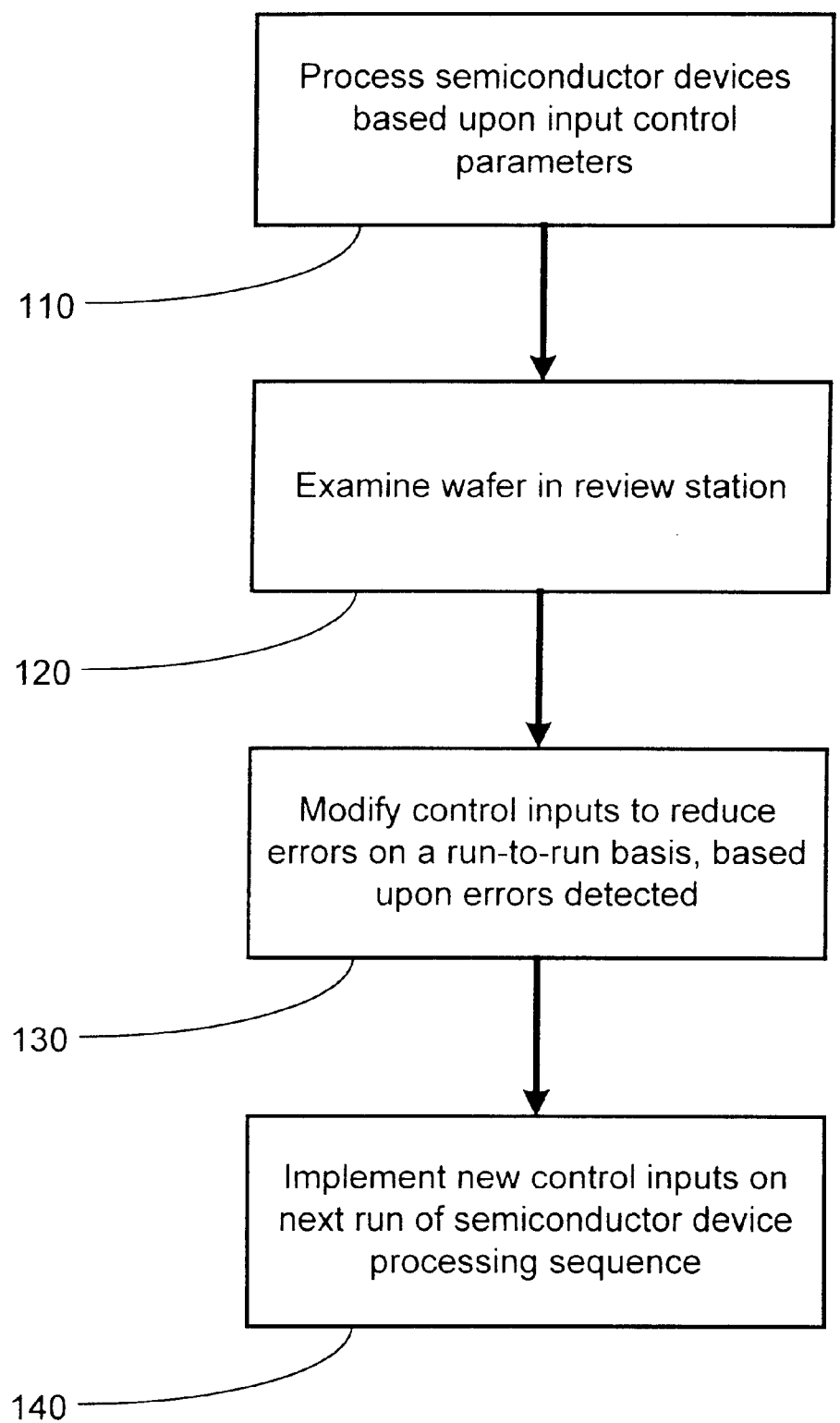
FIG. 1 illustrates one embodiment of the method taught by the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will, of course, be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Overlay process is an important step in semiconductor manufacturing. In particular, overlay process involves measuring misalignment errors between semiconductor layers during manufacturing processes. Improvements in the overlay process could result in substantial enhancements, in terms of quality and efficiency, in semiconductor manufacturing processes. The present invention provides a method of implementing automated error correction for control of overlay error. Furthermore, the present invention provides a method of controlling overlay registration on a run-to-run basis.

Figure 2:
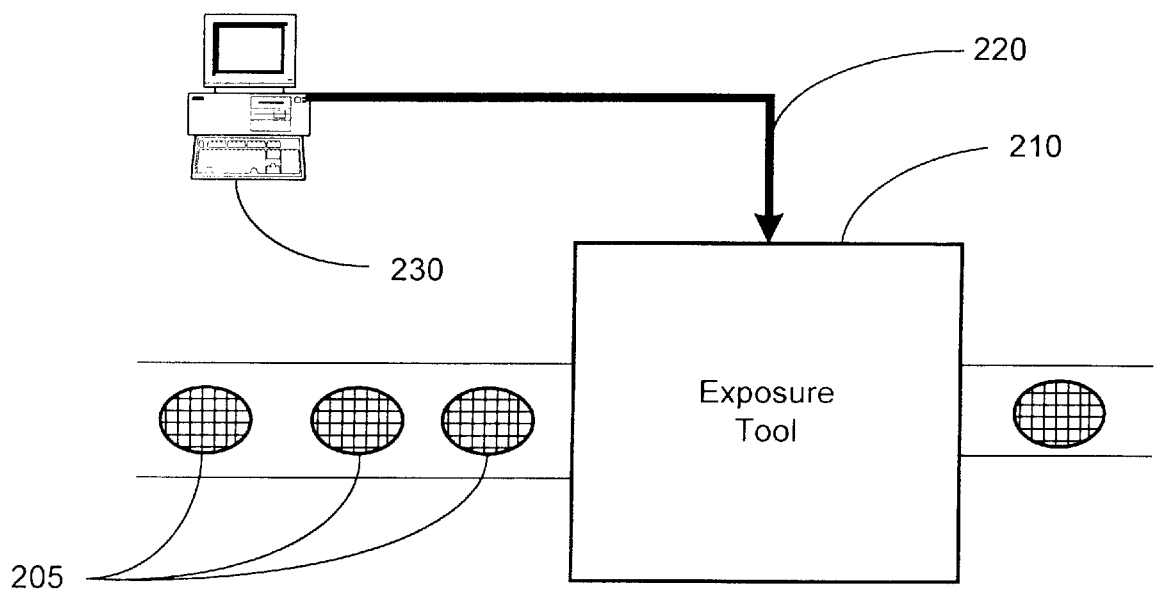
FIG. 2 illustrates semiconductor wafers being processed on an exposure tool, using a plurality of control input signals.

Turning now to FIG. 1, one embodiment of the method taught by the present invention is illustrated. Semiconductor devices are processed in a manufacturing environment using a number of input control parameters, as described in block 110. Turning now to FIG. 2, in one embodiment, semiconductor products 205, such as semiconductor wafers, are processed on an exposure tool 210 using a plurality of control input signals on a line 220. In one embodiment, the control input signals on the line 220 are sent to the exposure tool 210 from a computer system 230. One example of an exposure tool 210 used in semiconductor manufacturing processes is a stepper.

The control inputs, on the line 220, that are used to operate the exposure tool 210 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer being processed in the exposure tool. One of the primary features taught by the present invention is a method of updating the control input signals described above on a run-to-run basis.

When a process step in the exposure tool 210 is concluded, the semiconductor wafer that is being processed in the exposure tool 210 is examined in a review station, as described in block 120 of FIG. 1. One such review station is a KLA review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer. In one embodiment, the amount of misregistration that occurred can be attributed to the control inputs to a particular exposure process. The control inputs generally affect the accuracy of the process steps performed by the exposure tools on the semiconductor wafer. Modification of the control inputs can be utilized to improve the performance of the process steps employed in the exposure tool.

Figure 3:
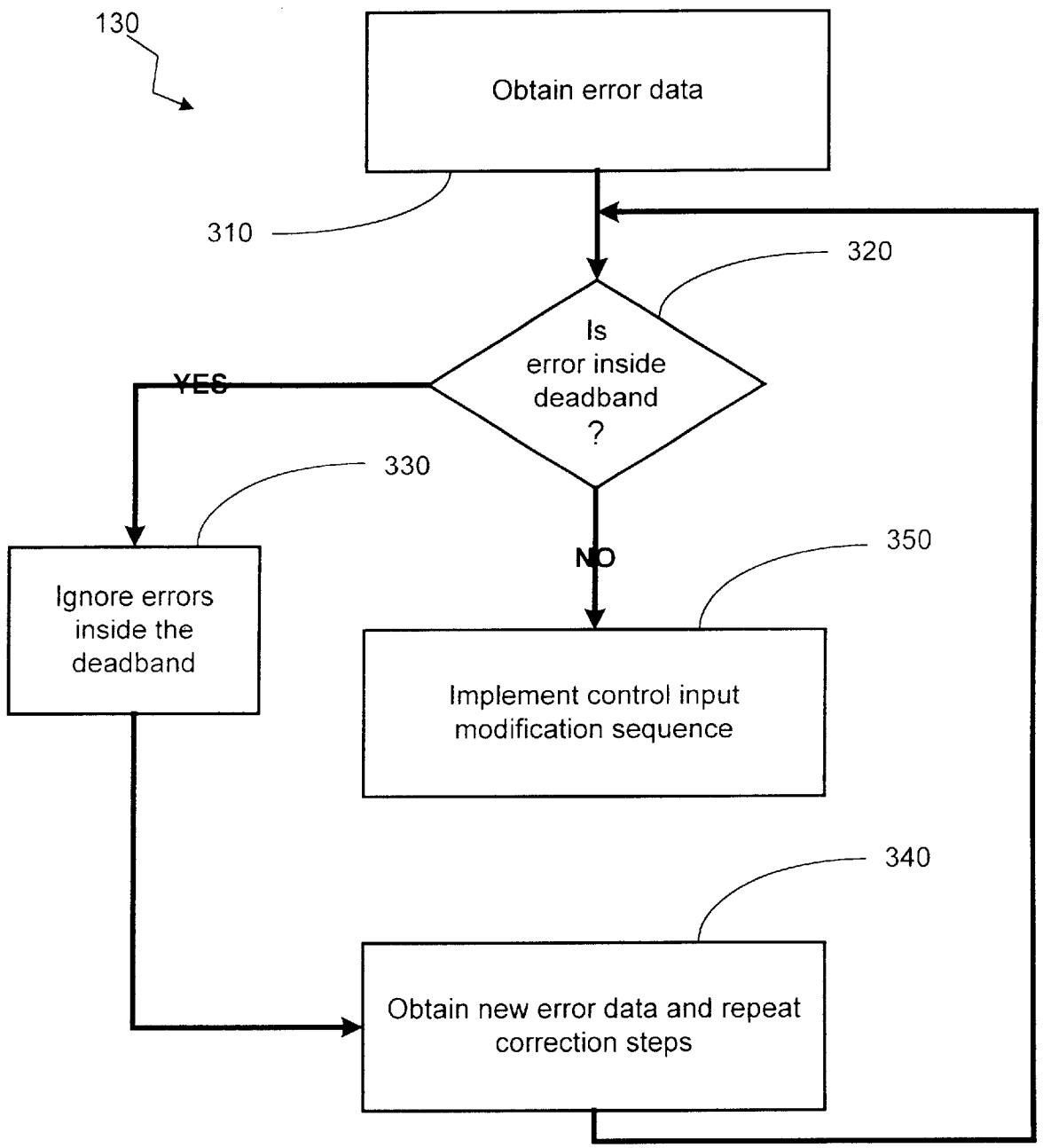
FIG. 3 depicts a more detailed illustration of the step described in block 130 of FIG. 1.

Once errors are determined from the examination after the run of a lot of wafers, as described in block 120 of FIG. 1, the control inputs on the line 220 are modified for a subsequent run of a lot of semiconductor wafers, as described in block 130 of FIG. 1. Modifying the control signals on the line 220 is designed to improve the next process step in the exposure tool 210. FIG. 3 depicts a more detailed illustration of the step described in block 130 of FIG. 1.

Turning now to FIG. 3, error data is obtained from the analysis of the data from the review station, as described in block 310. Once the error data is acquired, a determination is made whether the error data is inside the deadband, as described in block 320 of FIG. 3. The step described in block 320 is performed in order to determine whether an error is sufficiently significant to warrant a change in the control inputs on the line 220. To define the deadband, the errors acquired from the review station step described in block 120 of FIG. 1 are compared to a predetermined set of threshold parameters. In one embodiment, the deadband contains a range of error values associated with control input signals centered proximate to a set of corresponding predetermined target values, for which generally controller action is blocked. If any one of the errors acquired from the review station step is smaller than its corresponding predetermined threshold value, that particular error is deemed to be in the deadband. One of the primary purposes of the deadband is to prevent excessive control actions, resulting from changes to control input signals on the line 220, from causing a semiconductor manufacturing process to be inordinately jittery.

When a determination is made, as shown in block 320, that an error corresponding to a control input signal is inside the deadband, that particular error is ignored, as described in block 330 of FIG. 3. Therefore, when the value of an error that corresponds to a control input signal is found to be in the predetermined deadband, that particular error is not used to update its corresponding control input signal. New error data is then obtained and analyzed, as described in block 340 of FIG. 3. In one embodiment, the steps described above are repeated for the new error data that is obtained.

When a determination is made, as shown in block 320, that an error corresponding to a control input signal is not inside the deadband, further processing, such as implementing a control input modification sequence, is performed, as described in block 350 of FIG. 3. The value of the error corresponding to a control input signal is used to update that control input signal for a subsequent manufacturing process step. One embodiment of the control input signal modification sequence described in block 350 of FIG. 3 is illustrated in further detail in FIG. 4.

Figure 4:
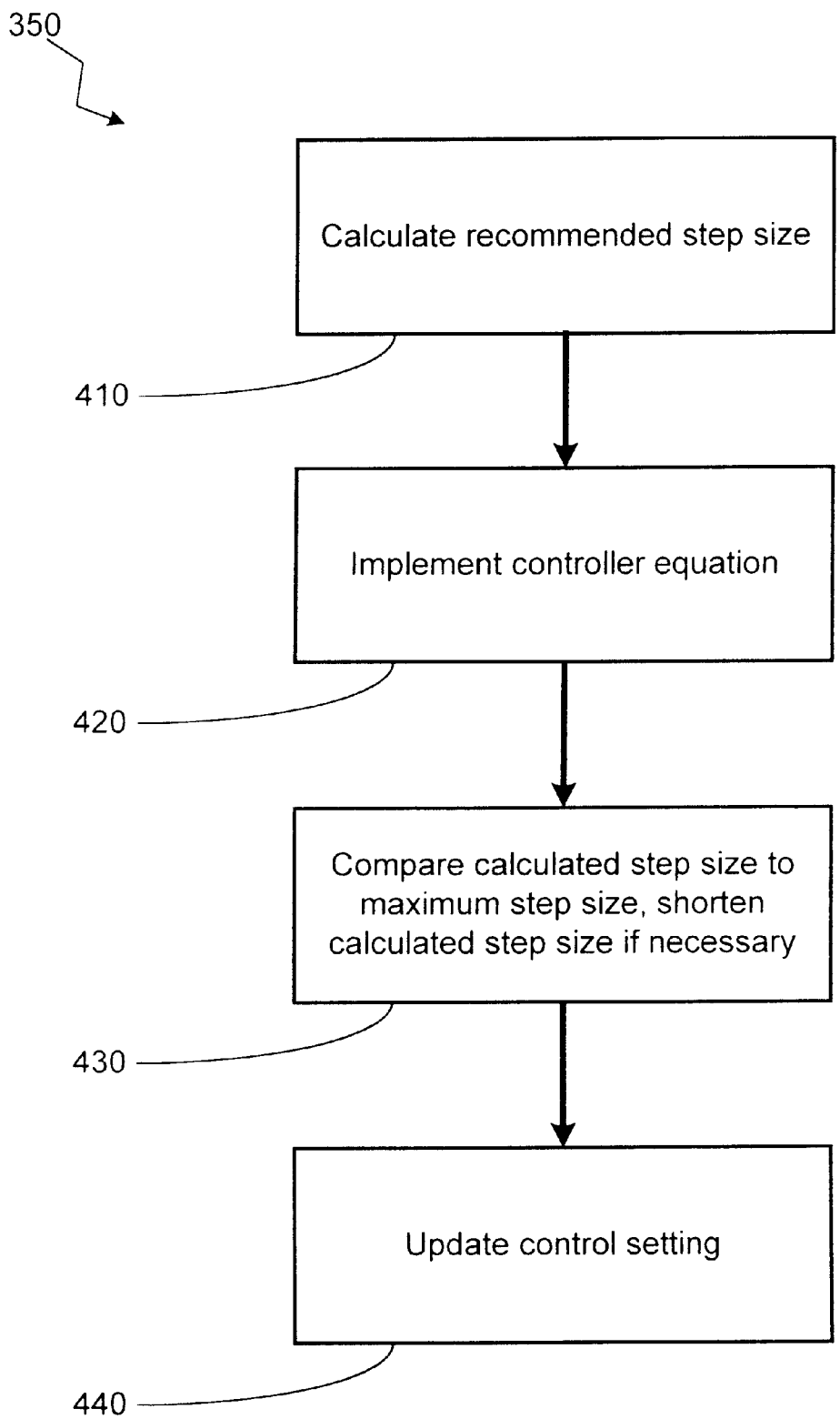
FIG. 4 illustrates in further detail one embodiment of the control input signal modification sequence described in block 350 of FIG. 3.

Turning now to FIG. 4, once the error data associated with a particular control input signal is acquired, a recommended step size of the change in the value of the control input signal is calculated, as described in block 410 of FIG. 4. The step size of the change in the value of the control input signal relates to the change in the magnitude of the value of the control input signal. The magnitude of the value of the control input signal determines the input characteristics of the settings of semiconductor manufacturing tools, such as the exposure tool 210. In one embodiment, the step size, which determines the new settings of the control input signal on line 220, is calculated using Equation 1, as described in block 420 of FIG. 4.

$$\text{New setting} = \text{Old setting} - [(\text{weight}) * (\text{error value})] \quad \text{Equation 1}$$

As illustrated in Equation 1, the new setting of the control input signal on the line 220 is calculated by subtracting the magnitude of the old setting of the control input signal by the product of the weight and the error value of the control input signal on the line 220. The weight is a predetermined parameter that is assigned to the error value of a particular control input signal on the line 220. The weight of an error value of a control input signal generally lies between zero and one. The use of the weight of the error value of a control input signal is one method of preventing a controller of a semiconductor manufacturing tool from operating in an inordinately jittery fashion. In other words, the value of the weight can be used to at least partially control the step size of the change of the new setting from the old setting of the control input signal.

Although the value of the weight can be used to partially control the step size of the change in the setting of the control input signal, the value of the weight may still be insufficient to prevent an excessively large step size. In other words, even if an optimum weight were to be assigned to a particular error signal, a calculated step size of a change in the setting of a control input signal may be too large, such that it could cause a controller of a semiconductor manufacturing tool to perform in an excessively jittery fashion. Therefore, the calculated step size is compared to a predetermined maximum step size that is allowable for the change in setting of a control input signal in the line 220, as described in block 430 of FIG. 4.

When a determination is made that the calculated step size of the change in the magnitude of the control input signal is smaller than the predetermined maximum step size, the calculated step size is used to compute the new settings of the control input signal. When a determination is made that the calculated step size of the change in the magnitude of the control input signal is larger than the predetermined maximum step size, the predetermined maximum step size is used to compute the new settings of the control input signal. Based upon the calculation of the step size of the new settings of the control input signal on the line 220, the control input signal is updated for the next manufacturing process step, as described in block 440 of FIG. 4.

The completion of the step described in block 440 concludes the step of implementing the control input modification sequence, as described in block 350 of FIG. 3. New error data for other control input signals are acquired and corrected using the steps described above. Once the relevant control input signals for a semiconductor manufacturing tool are updated, the control input signals with new, more accurate settings are used to perform a semiconductor manufacturing process step for a subsequent run of semiconductor devices, as described in block 140 of FIG. 1.

One method of using the updated control input signals on the line 220 is implemented by control threads. Control threads can be implemented by an overlay controller. Control threads add a good deal of complexity to the overlay control strategy. Control threads are a significant part of the control scheme of a semiconductor manufacturing tool, such as the exposure tool 210. Each of the different control threads acts like a separate controller, and is differentiated by various process conditions. For overlay control, the control threads are separated by a combination of different conditions, including the semiconductor manufacturing tool (e.g., stepper) currently processing the wafer lot, the semiconductor product, the semiconductor manufacturing operation, and the semiconductor manufacturing tool that processed the semiconductor wafer lot at a previous layer of the wafer.

The reason for keeping the control threads separate is that different semiconductor manufacturing process conditions affect the overlay error in different fashions. By isolating each of the unique semiconductor manufacturing process conditions into its own corresponding control thread, the overlay error can become a more accurate portrayal of the conditions in which a subsequent semiconductor wafer lot in the control thread will be processed. Since the error measurement is more relevant, changes to the control input signals based upon the error will be more appropriate. The implementation of the control scheme described by the present invention can lead to a reduction in the overlay error.

To illustrate the effectiveness of the control thread arrangement, consider the following example in which stepper operations are discussed. For example, Stepper A produces wafers with a translational error of 0.05 microns, Stepper B has an error of −0.05 microns, and Stepper C has 0.1 microns of error. If a semiconductor wafer lot was processed on Stepper A, then it was processed on Stepper B at the next layer, the overlay error between them would be −0.1 microns. If the lot were processed on Stepper B and Stepper C instead, the error would be 0.15 microns. The error is different depending upon which conditions were present when the lot was processed. Below is a table of the possible error outcomes, given the stepper/stepper pair used in processing.

TABLE 1

ERROR AS A FUNCTION OF STEPPER/STEPPER PAIR

|  | Stepper A | Stepper B | Stepper C |
| --- | --- | --- | --- |
| Stepper A | 0 | −0.1 | 0.05 |
| Stepper B | 0.1 | 0 | 0.15 |
| Stepper C | −0.05 | −0.15 | 0 |

One of the advantages of the control thread framework is illustrated in this example. There are three possible overlay error values for each of the steppers, depending upon which stepper processed the wafer lot at the last layer. One problem that arises is the controller cannot predict what the error will be for the next semiconductor wafer lot that is processed on the same semiconductor manufacturing tool. Utilizing the control threads, each of the conditions illustrated in Table 1 would have its own controller. Since only one condition would exist for each controller, that controller would be able to predict the error that the next semiconductor wafer lot could encounter and adjust the control input signals accordingly.

Overlay metrology is an important part of any semiconductor manufacturing tool control strategy described above. Review stations, such as KLA review stations, are capable of providing the control algorithm that can measure the control error. Each of the error measurements corresponds to one of the control input signals on the line 220, in a direct manner. Before the error can be utilized to correct control input signals, a certain amount of preprocessing is generally completed. This additional complexity is designed to make the error estimates provided by the review stations more accurate.

One of the first steps in the preprocessing, or data manipulation, of control input signals is outlier rejection. Outlier rejection is a gross error check that is employed to ensure that the data that is received is reasonable in light of the historical performance of the semiconductor manufacturing process. This procedure involves comparing each of the overlay errors to its corresponding predetermined boundary parameter. In one embodiment, even if one of the predetermined boundaries is exceeded, the error data from the entire semiconductor wafer lot is generally rejected. To determine the limits of the outlier rejection, thousands of actual semiconductor manufacturing fabrication (fab) data points are collected. The standard deviation for each error parameter in this collection of data is then calculated. In one embodiment, for outlier rejection, nine times the standard deviation (both positive and negative) is generally chosen as the predetermined boundary. This was done primarily to ensure that only the points that are significantly outside the normal operating conditions of the process are rejected.

The next stage in the process is to smooth out the data, also known as filtering. This is important because the error measurements are subject to a certain amount of randomness, such that the error significantly deviates in value. Filtering the review station data results in a more accurate assessment of the error in the control input signal settings. In one embodiment, the overlay control scheme utilizes a filtering procedure known as an Exponentially-Weighted Moving Average (EWMA) filter, although other filtering procedures can be utilized in this context. The equation for the EWMA filter is illustrated in Equation 2.

New average=(weight)*(current measurement)+(1− weight)*(previous EWMA average)]  Equation 2

Figure 5:
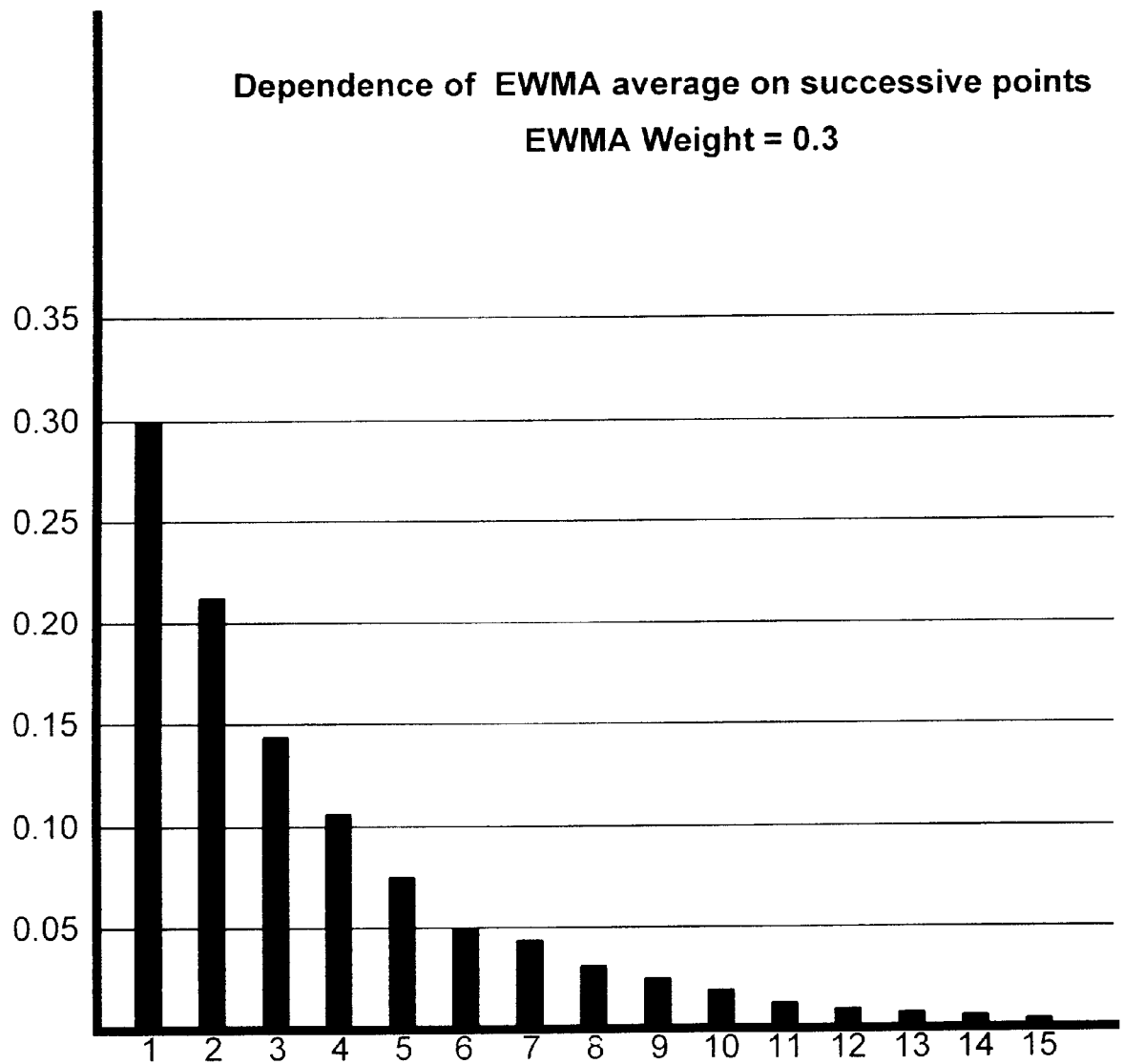
FIG. 5 illustrates the dependence of the average on each successive point in an EWMA filter.

The weight is an adjustable parameter that can be used to control the amount of filtering and is generally between zero and one. The weight represents the confidence in the accuracy of the current data point. If the measurement is considered to be accurate, the weight should be close to one. If there were a significant amount of fluctuations in the process, then a number closer to zero would be appropriate. The new average is calculated from the current measurement, the weight, and the last average calculated. The dependence of the average on each successive point is illustrated in FIG. 5.

In one embodiment, there are at least two methods of utilizing the EWMA filtering process. The first implementation is to use the previous average, the weight, and the current measurement as described above. Among the advantages of utilizing the first implementation are ease of use and minimal data storage. One of the disadvantages of utilizing the first implementation is that this method generally does not retain much process information. Furthermore, the previous average calculated in this manner would be made up of every data point that preceded it, which may be undesirable. The second option is to retain only some of the data and calculate the average from the raw data each time.

The manufacturing environment in the semiconductor manufacturing fab presents some unique challenges. The order that the semiconductor wafer lots are processed through a semiconductor manufacturing tool, such as a stepper, may not correspond to the order in which they are read on the review station. This could lead to the data points being added to the EWMA average out of sequence. Semiconductor wafer lots may be analyzed more than once to verify the error measurements. With no data retention, both readings would contribute to the EWMA average, which may be an undesirable characteristic. Furthermore, some of the control threads may have low volume, which may cause the previous average to be outdated such that it may not be able to accurately represent the error in the control input signal settings.

For the reasons discussed above, and for other considerations, the overlay controller uses limited storage of data to calculate the EWMA filtered error. Semiconductor wafer lot data, including the lot number, the time the lot was processed on the semiconductor manufacturing tool, such as the stepper, and the multiple error estimates, are stored in a data storage (called Data Store in one embodiment) under the control thread name. When a new set of data is collected, the stack of data is retrieved from Data Store and analyzed.

The lot number of the current semiconductor wafer lot being processed is compared to those in the stack. If the lot number matches any of the data present there, the error measurements are replaced. Otherwise, the data point is added to the current stack in chronological order, according to the time periods when the lots were processed through the stepper. In one embodiment, any data point within the stack that is over 48 hours old is removed. Once the aforementioned steps are complete, the new filter average is calculated and stored to Data Store.

The principles taught by the present invention can be implemented in an Advanced Process Control (APC) Framework. The APC is a preferred platform from which to implement the overlay control strategy taught by the present invention. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the overlay controller. The control methods are generally defined and performed in these scripts. The development of these scripts can comprise a significant portion of the development of a control system.

In one embodiment, for the overlay control project, there are four separate scripts that perform all of the necessary tasks. There is one script each for the ASM stepper and the review station, a script to handle the actual data capture from the review station, and another subscript that contains common procedures that can be referenced by any of the other scripts. Examination of these scripts, and how they interact with the production flow, can reveal the actual control action enacted by the overlay control scheme taught by the present invention.

In one embodiment the overlay control procedure begins at the source/drain portion of the semiconductor device fabrication procedure. The ASM steppers are used to expose the photoresist, which in turn defines the active areas of the wafer. The overlay controller will treat this as the previous layer when it processes wafer lots through the poly gate steps, so some information is required from wafer lots run at this step. In one embodiment, before the semiconductor manufacturing tools are run, an APC script is called to initialize the machine. At this step, the script records the entity number of the semiconductor manufacturing tool and the wafer lot number. The entity number is then stored against the lot number in Data Store. The rest of the script, such as the APCData call and the Setup and StartMachine calls, are formulated with blank or dummy data in order to force the machine to use its default settings.

The subsequent time that semiconductor wafer lots enter the domain of the controller is generally during the poly gate portion of semiconductor device fabrication. This is the patterned level that is just above the source/drain layer.

These two adjacent patterned layers are subject to overlay metrology, which enable the use of feedback control to correct errors in overlay. This is generally true for any two adjacent patterned layers that are followed by a review station metrology step. To enable control action, a control thread corresponding to the current semiconductor wafer lot is created from the process information.

The control thread for the overlay control scheme depends upon the current stepper, current operation, the product code for the current lot, and the entity number at the previous patterned layer. The first three parameters are generally found in the context information that is passed to the script from the current stepper. The fourth parameter is generally stored when the lot is processed through the previous layer. Once all four parameters are defined, they are combined to form the control thread name; STP02_OPER01_PROD01_STP01 is an example of a control thread name. The control thread name is also stored in correspondence to the wafer lot number in Data Store.

Once the lot is associated with a control thread name, the stepper settings for that control thread are generally retrieved from Data Store. There are at least two possibilities when the call is made for the information. One possibility is that there are no settings stored under the current control thread name. This can happen when the control thread is new, or if the information was lost or deleted. In these cases, the script initializes the control thread assuming that there is no error associated with it and uses the target values of the overlay errors as the control input settings. It is preferred that the controllers use the default machine settings as the initial settings. By assuming some settings, the overlay errors can be related back to the control settings in order to facilitate feedback control.

Another possibility is that the settings are stored under the control thread name. In this case, one or more semiconductor wafer lots have been processed under the same control thread name as the current semiconductor wafer lot, and have also been measured for overlay error using the review stations. When this information exists, the control input signal settings are retrieved from Data Store. These settings are then downloaded to the ASM stepper via the APCData call.

Finally, the wafer lots are measured on the review stations after exposure on the steppers. The script begins with a number of APC commands to allow for the collection of data. The review station script then locks itself in place and activates a Data Available script. This script facilitates the actual transfer of the data from the review station to the APC framework. Once the transfer is completed, the script exits and unlocks the review station script. The interaction with the review station is then generally complete.

In one embodiment, after the data is collected, it is processed to generate an estimate of the current error in the control input signal settings. Firsts the data is passed to a compiled Matlab plug-in that performs the outlier rejection criteria described above. The inputs to a plug-in interface are the multiple error measurements and an array containing boundary values. The return from the plug-in interface is a single toggle variable. A nonzero return denotes that it has failed the rejection criteria, otherwise the variable returns the default value of zero and the script continues to process.

After the outlier rejection is completed, the data is passed to the EWMA filtering procedure. The controller data for the control thread name associated with the lot is retrieved, and all of the relevant operation upon the stack of lot data is carried out. This includes replacing redundant data or removing older data. Once the data stack is adequately prepared, it is parsed into ascending time-ordered arrays that correspond to the error values. These arrays are fed into the EWMA plug-in along with an array of the parameters required for its execution. In one embodiment, the return from the plug-in is comprised of the six filtered error values.

The final step in the process is to calculate the new settings for the stepper. The previous settings for the control thread corresponding to the current wafer lot are retrieved from Data Store. This data is paired along with the current set of overlay errors. The new settings are calculated by calling a compiled Matlab plug-in. This application incorporates a number of inputs, performs calculations in a separate execution component, and returns a number of outputs to the main script. Generally, the inputs of the Matlab plug-in are the control input signal settings, the review station errors, an array of parameters that are necessary for the control algorithm, and a currently unused flag error. The outputs of the Matlab plug-in are the new controller settings, calculated in the plug-in according to the controller algorithm described above. A photolithography process engineer or a control engineer, who generally determines the actual form and extent of the control action, can set the parameters. They include the threshold values, maximum step sizes, controller weights, and target values. Once the new parameter settings are calculated, the script stores the setting in Data Store such that the steppers can retrieve them for the next wafer lot to be processed. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for correction of overlay control errors, comprising:

processing semiconductor wafers associated with a control thread based upon at least one control input parameter;

examining said processed semiconductor wafers in a review station, said examining comprising calculating a weight of an error value of said control input parameter based upon data relating to a previous process associated with said control thread;

modifying said control input parameter in response to said examination of said processed semiconductor wafers to form a new control input parameter; and implementing said new control input parameter for a subsequent batch of the semiconductor wafers associated with said control thread.

2. A system, comprising:

a processing tool for processing a semiconductor wafer based upon at least one control input parameter; and a controller operatively coupled to said processing tool, said controller adapted to receive data relating to an examination of said semiconductor wafer, calculate a weight of an error value of said control input parameter based upon said examination, and modify said control input parameter in response to said weight of said error value.

3. The system of claim 2, wherein said processing tool to perform a subsequent processing upon said semiconductor wafer based upon said modified control input parameter.

4. The system of claim 2, wherein said processing tool is an exposure tool.

5. The system of claim 4, wherein said controller being further adapted to modify a control input parameter that comprises at least one of an x translation signal, a y-translation signal, an x-expansion wafer scale signal, a y-expansion wafer scale signal, a reticle magnification signal, and a reticle rotation signal.

6. The system of claim 2, wherein said controller being further adapted to acquire a quantitative measure of an amount of misregistration caused by a prior exposure process.

7. The system of claim 6, wherein said controller being further adapted to implement an outlier rejection and exponentially-weighted moving average filtering techniques upon said data relating to said examination of said semiconductor wafer.

8. The system of claim 6, wherein said controller being further adapted to acquire a quantitative measure of the amount of misregistration relating to a misalignment in a semiconductor manufacturing process that occurred between two layers of said semiconductor wafer.

9. The system of claim 2, wherein said controller being further adapted to:
acquire error data relating to said semiconductor wafer;
determine whether a value of said error data is inside a deadband;
ignore said error data in response to a determination that said value of error data is inside said deadband; and
implement a control input modification sequence in response to a determination that said value of error data is not inside said deadband.

10. The system of claim 9, wherein said controller being further adapted to acquire error data relating to said semiconductor wafer from a review station.

11. The system of claim 9, wherein said controller being further adapted to determine a range of error values associated with said control input parameter centered proximate to a set of corresponding predetermined target values.

12. The system of claim 9, wherein said controller being further adapted to:
calculate a recommended step size in response to said error data;
determine a maximum step size;
compare said calculated step size to said maximum step size; and
update said control input parameter in response to said comparison of said calculated step size to said maximum step size.

13. The system of claim 12, wherein said controller being further adapted to calculate said recommended step size using a controller equation.

14. The system of claim 12, wherein said controller being further adapted to use said calculated step size to update said control input parameter in response to a determination that said calculated step size is smaller than the said maximum step size.

15. The system of claim 14, wherein said controller being further adapted to use said maximum step size to update said control input parameter in response to a determination that said calculated step size is larger than the said maximum step size.

16. The system of claim 15, wherein said controller being further adapted to update said control input parameter on a run-to-run basis.

17. An apparatus, comprising:
a controller adapted to receive data relating to an examination of a processed semiconductor wafer, calculate a weight of an error value of a control input parameter related to processing said semiconductor wafer based upon said
examination, and modify said control input parameter in response to said weight of said error value.

18. The apparatus of claim 17, wherein said controller being further adapted to provide said modified control input parameter to a processing tool for controlling a subsequent process performed upon said semiconductor wafer.

19. The apparatus of claim 18, wherein said controller being further adapted to provide said modified control input parameter to an exposure tool for controlling a subsequent exposure process performed upon said semiconductor wafer.

20. The apparatus of claim 19, wherein said controller being further adapted to receive modify a control input parameter that comprises at least one of an x-translation signal, a y-translation signal, an x-expansion wafer scale signal, a y-expansion wafer scale signal, a reticle magnification signal, and a reticle rotation signal.

21. The apparatus of claim 17, wherein said controller being further adapted to acquire a quantitative measure of an amount of misregistration caused by a prior exposure process.

22. The apparatus of claim 21, wherein said controller being further adapted to implement an outlier rejection and exponentially-weighted moving average filtering techniques upon said data relating to said examination of said semiconductor wafer.

23. The apparatus of claim 21, wherein said controller being further adapted to acquire a quantitative measure of the amount of misregistration relating to a misalignment in a semiconductor manufacturing process that occurred between two layers of said semiconductor wafer.

24. The apparatus of claim 17, wherein said controller being further adapted to:
acquire error data relating to said semiconductor wafer;
determine whether a value of said error data is inside a deadband;
ignore said error data in response to a determination that said value of error data is inside said deadband; and
implement a control input modification sequence in response to a determination that said value of error data is not inside said deadband.

25. The apparatus of claim 24, wherein said controller being further adapted to acquire error data relating to said semiconductor wafer from a review station.

26. The apparatus of claim 24, wherein said controller being further adapted to determine a range of error values associated with said control input parameter centered proximate to a set of corresponding predetermined target values.

27. The apparatus of claim 24, wherein said controller being further adapted to:
calculate a recommended step size in response to said error data;
determine a maximum step size;
compare said calculated step size to said maximum step size; and
update said control input parameter in response to said comparison of said calculated step size to said maximum step size.

28. The apparatus of claim 27, wherein said controller being further adapted to calculate said recommended step size using a controller equation.

29. The apparatus of claim 27, wherein said controller being further adapted to use said calculated step size to update said control input parameter in response to a determination that said calculated step size is smaller than the said maximum step size.

30. The apparatus of claim 29, wherein said controller being further adapted to use said maximum step size to update said control input parameter in response to a determination that said calculated step size is larger than the said maximum step size.

31. The apparatus of claim 30, wherein said controller being further adapted to update said control input parameter on a run-to-run basis.

* * * * *

UNITED STATES PATENT AND TRADEMARK OFFICE
CERTIFICATE OF CORRECTION

PATENT NO.     : 6,622,061 B1                                                              Page 1 of 1
DATED          : September 16, 2003
INVENTOR(S)    : Anthony J. Toprac, Christopher A. Bode and Richard D. Edwards It is certified that error appears in the above-identified patent and that said Letters Patent is hereby corrected as shown below:

Column 9,
Line 54, replace "Firsts" with -- First, --.

Signed and Sealed this

Eighteenth Day of November, 2003

JAMES E. ROGAN
*Director of the United States Patent and Trademark Office*